(12) United States Patent
Sasaki

(10) Patent No.: US 6,512,229 B2
(45) Date of Patent: Jan. 28, 2003

(54) PROCESS FOR PREPARING A BOLOMETER MATERIAL AND BOLOMETER DEVICE

(75) Inventor: Tokuhito Sasaki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/799,001

(22) Filed: Mar. 6, 2001

(65) Prior Publication Data

US 2001/0028034 A1 Oct. 11, 2001

(30) Foreign Application Priority Data

Mar. 7, 2000 (JP) ......................... 2000-062231

(51) Int. Cl.$^7$ ................................ G01J 5/20
(52) U.S. Cl. ..................... 250/338.1; 250/332
(58) Field of Search ................ 250/338.1, 338.3, 250/332; 338/15, 18

(56) References Cited

U.S. PATENT DOCUMENTS 5,801,383 A * 9/1998 Wada et al. ............... 250/332
5,900,799 A * 5/1999 Morris ....................... 338/18
6,322,670 B2 * 11/2001 Cole et al. ............. 204/157.41

FOREIGN PATENT DOCUMENTS

| JP | 08-062035 | 3/1996 |
| JP | 08-128889 | 5/1996 |
| JP | 08-136343 | 5/1996 |
| JP | 09-145481 | 6/1997 |
| JP | 09-288010 | 11/1997 |
| JP | 10-274561 | 10/1998 |

* cited by examiner

Primary Examiner—Constantine Hannaher
Assistant Examiner—Tim Moran
(74) Attorney, Agent, or Firm—Young & Thompson

(57) ABSTRACT

Crystal phase $V_2O_3$ with x=1.5 in $VO_x$ is prepared. Such a lower specific resistance than a desired one as a starting film quality is modified to the final desired specific resistance by heating under an oxidizing atmosphere. A protective film for a bolometer material is formed by physical vapor deposition.

16 Claims, 6 Drawing Sheets

PROCESS FOR PREPARING A BOLOMETER MATERIAL AND BOLOMETER DEVICE

BACKGROUND OF THE INVENTION

1. Field of the Invention

This invention relates to a process for preparing a bolometer material having excellent properties which is used in a temperature-measuring apparatus in which a sensor device is formed using a material utilizing thermal variation of resistance, or a non-cooling type of two-dimensional infrared imaging apparatus not requiring a cooling device, in which a material utilizing thermal variation of resistance is formed as an element and the element is two-dimensionally aligned. This invention also relates to a bolometer device formed by the process, in particular a process for preparing a protective film which does not deteriorate the above excellent properties.

2. Description of the Prior Art

Generally, a metal oxide with relatively large thermal variation of resistance (or TCR: Temperature Coefficient of Resistance) is used as a material suitable to a bolometer. In particular, vanadium oxide $VO_x$ is known to easily provide a higher TCR value. For applying $VO_x$ as a sensor in a non-cooling type of two-dimensional infrared imaging apparatus, it must have a thin-film form. A $VO_x$ thin-film is generally formed by physical vapor deposition such as vacuum deposition and sputtering (An example of preparation by sputtering has been disclosed in Jerominek et al., Optical Engineering, 32 (9), p. 2093 (paragraph 2) (1993)).

Furthermore, for using $VO_x$ as a bolometer device, a higher TCR is, of course, required to achieve higher sensitivity and a specific resistance of $VO_x$ (or synonymically "resistivity") must be controlled to a value necessary for configuring a circuit. For example, for achieving such controlling, Wada et al. has disclosed in JP-A 9-145481 a process for providing required specific resistance and TCR value with a heating temperature during a $VO_x$ thin-film is heated under a reducing atmosphere containing hydrogen.

In such a process for controlling TCR and specific resistance with a heating temperature, as illustrated in FIG. 6, a $VO_x$ film is deposited and a crystal phase of $V_2O_5$ (x=2.5) is formed. Then, it is heated and reduced under an atmosphere containing hydrogen. Table 1 shows properties obtained by such a prior art procedure. FIG. 1 shows a relationship between TCR and specific resistance obtained by the prior art. As seen from FIG. 1, in this prior art, a TCR of −2%/K provides $VO_x$ (x is approximately 2) having a specific resistance of about 0.3 Ωcm ($3 \times 10^{-3}$ Ωm). In the prior art, a material such $VO_x$ property (x is approximately 2) has been used for forming a device.

TABLE 1

Properties of $VO_x$ films prepared by a Prior Art process (Temperature Coefficient of Resistance (TCR) and specific resistance)

| TCR [%/K] | Specific Resistance [Ωm] |
|---|---|
| 0.15 | 2.00E−05 |
| 0.07 | 7.00E−05 |
| −0.159 | 7.08E−05 |
| −0.215 | 7.13E−05 |
| −0.169 | 9.40E−05 |

TABLE 1-continued

Properties of $VO_x$ films prepared by a Prior Art process (Temperature Coefficient of Resistance (TCR) and specific resistance)

| TCR [%/K] | Specific Resistance [Ωm] |
|---|---|
| −0.31 | 1.02E−04 |
| −0.67 | 1.30E−04 |
| −1.427 | 5.84E−04 |
| −1.4 | 7.30E−04 |
| −1.528 | 7.39E−04 |
| −1.582 | 8.78E−04 |
| −1.559 | 8.98E−04 |
| −1.42 | 9.00E−04 |
| −1.607 | 1.04E−03 |
| −1.59 | 1.63E−03 |
| −1.75 | 1.73E−03 |
| −1.78 | 1.80E−03 |
| −1.58 | 1.98E−03 |
| −1.59 | 2.20E−03 |
| −1.7 | 2.25E−03 |
| −1.73 | 3.67E−03 |
| −2.12 | 5.20E−03 |
| −2.17 | 5.30E−03 |

When forming a device using a material such properties, an insulating film such as a silicon oxide ($SiO_2$) film and a silicon nitride (SiN) film is generally formed as a protective film on the surface of $VO_x$ by chemical vapor deposition (CVD) for preventing deterioration in the properties.

According to a conventional process, a lower heating temperature must be employed for providing $VO_x$ with higher sensitivity (higher TCR). However, a lower heating temperature increases a TCR while increasing a specific resistance.

As a specific resistance is increased, charged carriers in the $VO_x$ thin-film are reduced, leading to increase of a so-called 1/f noise (f is a frequency), i.e., a frequency noise proportional to an inverse of the number of charged carriers. Therefore, in the prior art process, noise increase is prevented by increasing a volume of $VO_x$ for increasing the number of carriers, i.e., increasing a film thickness.

Increase in a volume is, however, not preferable for processing the material as a device. For example, a thicker film may lead to a longer heating time. Furthermore, it may lead to a larger step on a side after processing, i.e., poor flatness, which may cause the problem in process working that a metal interconnection even with a thickness of about 0.1 μm may be broken.

Additionally, when forming a protective film in a bolometer by CVD, a substrate is generally heated to a temperature of 200° C. or higher and then very reactive gases such as silan ($SiH_4$), ammonia ($NH_3$) and/or dinitrogen monoxide ($N_2O$) are used, which may react with $VO_x$ to be protected to change $VO_x$ properties.

SUMMARY OF THE INVENTION

Objectives of this invention are to improve quality of a $VO_x$ film having a specific resistance such that 1/f noise is reduced while giving higher sensitivity (higher TCR) than the prior art and to provide processes for preparing a bolometer material and for forming a protective film which allow us to coat the $VO_x$ surface with a protective film while maintaining the property.

In this invention, crystal phase of $VO_x$ prepared is $V_2O_3$ (x=1.5), i.e., a starting film is made of a material having a specific resistance lower than a desired value for a material used as a bolometer. The crystal phase is heated under an oxidizing atmosphere containing oxygen for modifying the crystal phase to that with the desired specific resistance. In this thermal processing, the film property is controlled by adjusting not a temperature, but a thermal oxidation time.

Specifically, this invention provides a process for preparing a material for a bolometer using a vanadium oxide $VO_x$ film, wherein crystal phase comprising $V_2O_3$ (x=1.5) is used as a starting film material and the crystal phase is heated under an oxidizing atmosphere containing oxygen.

In this invention, the $VO_x$ surface is coated with a protective film such as a silicon nitride film $SiN_x$ or a silicon oxynitride film $SiO_x \cdot N_y$ by physical deposition such as sputtering for protecting the improved $VO_x$ property to provide a bolometer device.

The preparation process for a bolometer material of this invention may be used to improve the bolometer material property in comparison with that according to the prior art, and thus to provide a high-performance infrared sensor device with higher sensitivity and reduced 1/f noise of the bolometer material without deterioration in the property. Furthermore, since a film thickness may be reduced compared with that in the prior art, processing for forming a device may be more easily conducted.

Additionally, according to a process for forming a protective film of this invention, a protective film can be formed without deterioration in the excellent properties of the $VO_x$ film.

DETAILED DESCRIPTION OF PREFERRED EMBODIMENTS

In thermal oxidation, oxidation proceeds in a depth direction by diffusion from a surface and under the condition of a constant temperature, a depth and a concentration in oxidation depend on a thermal oxidation time. Hydrogen may easily penetrate a film due to its small atomic size, i.e., is not diffused, so that its reaction cannot be controlled by time.

For film quality (a specific resistance), a specific resistance varies by more than two digits in the prior art. The variation may be reduced to about two digits by using $VO_x$ with a small oxidation number($V_2O_3$(x=1.5)). In other words, an absolute value of a specific resistance may be more easily controlled than the prior art.

A protective film $SiN_x$ is formed by physical deposition without heating a substrate and highly reactive gases such as CVD, so that properties of a $VO_x$ to be coated may not be deteriorated. Furthermore, $SiO_x \cdot N_y$ may be used as a protective film to significantly minimize stress during forming a device because the material has a quite small internal stress, resulting in solving problems such as peeling of the protective film.

Embodiments of this invention will be described.

Figure 5:
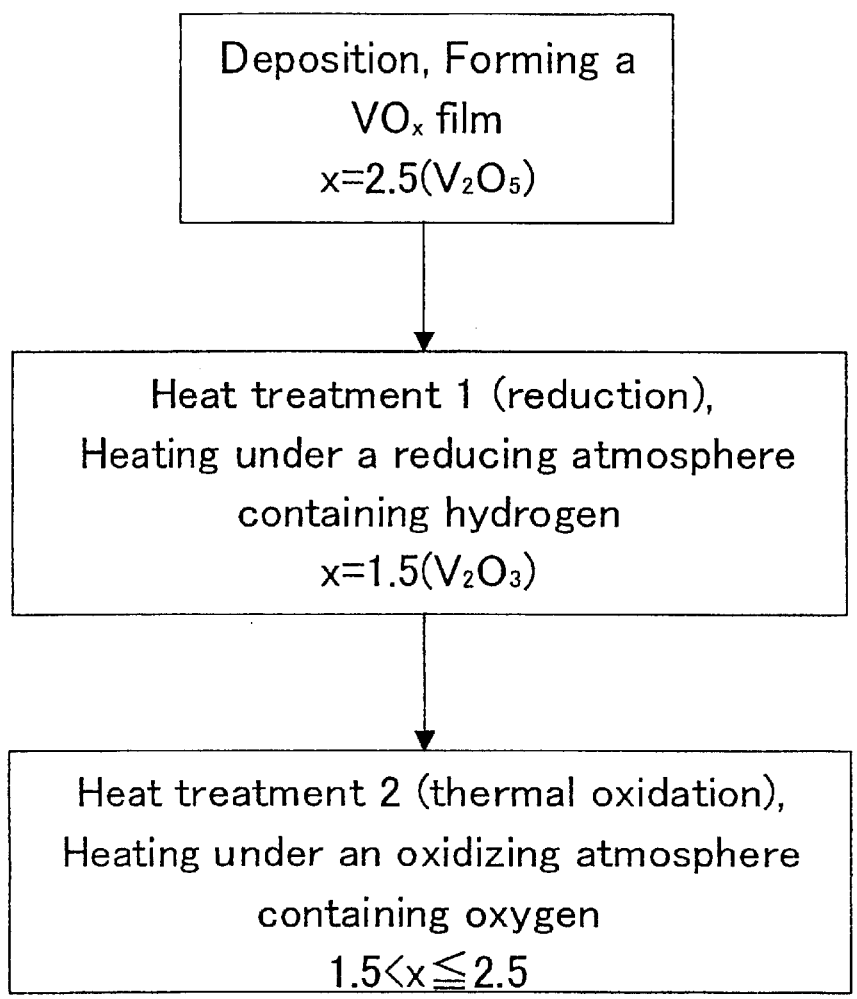
FIG. 5 illustrates a preparation procedure for a $VO_x$ film according to this invention.
Figure 6:
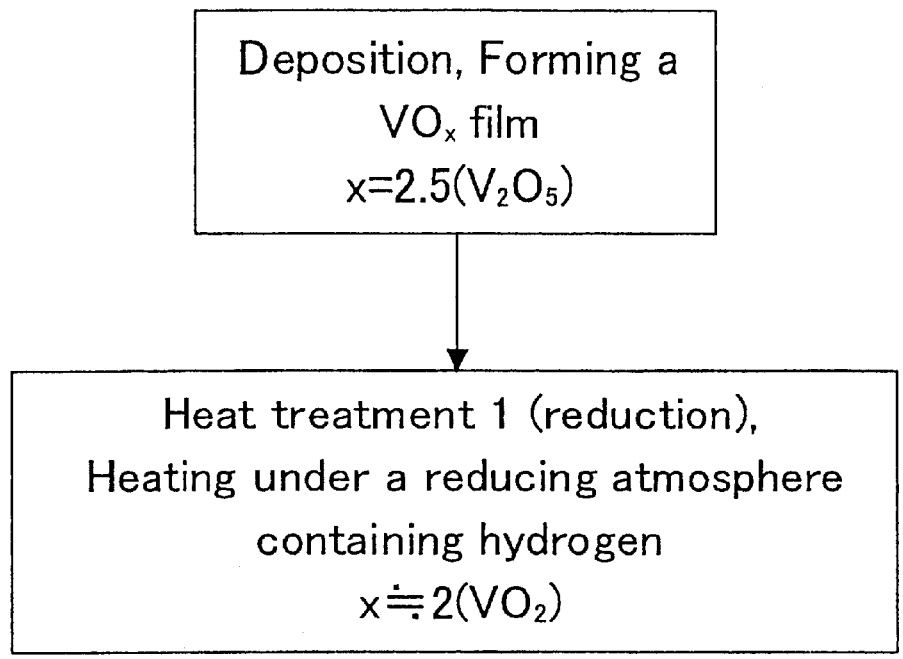
FIG. 6 illustrates a preparation procedure for a $VO_x$ film according to the prior art.

FIG. 5 shows a procedure for preparing a bolometer material according to this invention.

A $VO_x$ film as a bolometer material was deposited by reactive sputtering.

In the reactive sputtering, vanadium metal with a size of 8 inch was used as a sputtering target. A substrate on which the $VO_x$ film was formed was a silicon wafer with a size of 6 inch. Sputtering gases were argon and oxygen at rates of 14 sccm and 1 sccm, respectively. After cleaning the surface of the vanadium target by preliminary sputtering with a sputtering pressure of 0.53 Pa and a high-frequency power of 500 W for 30 minutes, deposition of the $VO_x$ film was initiated. The deposited film had a thickness of about 0.1 $\mu$m ($1 \times 10^{-7}$ m). X-ray diffraction analysis indicated that crystal phase of the $VO_x$ prepared under these conditions was predominantly $V_2O_5$ (x is 2.5 in $VO_x$). Similar film quality may be also provided by physical vapor deposition such as vacuum deposition using $V_2O_5$ as an evaporation source.

Then, heat treatment 1 was conducted as illustrated in FIG. 5. This heating may be conducted by a conventional procedure for lowering the resistance of $VO_x$. Specifically, the $VO_x$ (x=2.5) thin-film deposited was placed in a vacuum vessel, a reducing atmosphere gas containing hydrogen was introduced for heating and then it was subject to heating. Herein, an atmosphere gas of hydrogen and argon at $4.1 \times 10^4$ Pa was introduced and the film was heated at a heating temperature of 380° C. for 8 hours. The heated $VO_x$ was reduced by hydrogen to give $V_2O_3$ (x=1.5), in which properties are as follows: a specific resistance: $2 \times 10^{-5}$ to $5 \times 10^{-5}$ $\Omega$m, TCR: +0.1 %/K.

Heat treatment 2 which characterizes this invention was conducted as also illustrated FIG. 5. This heating is conducted under an atmosphere containing oxygen. In other words, since this heating can be conducted in the air, it does not require special equipment such as a furnace and vacuum equipment. Here, a hot plate was used to thermally oxidize the above wafer comprising the $V_2O_3$ (x=1.5) thin-film after heat treatment 1 (reduction) illustrated in FIG. 5. A temperature and duration may be appropriately selected as long as oxygen can diffuse into the $VO_x$ thin-film to oxidize the $VO_x$ thin-film. In this case, thermal oxidation was conducted at 250° C. for 200 min. This heat treatment provided a $VO_x$ with $1.5 < x \leq 2$.

Figure 2:
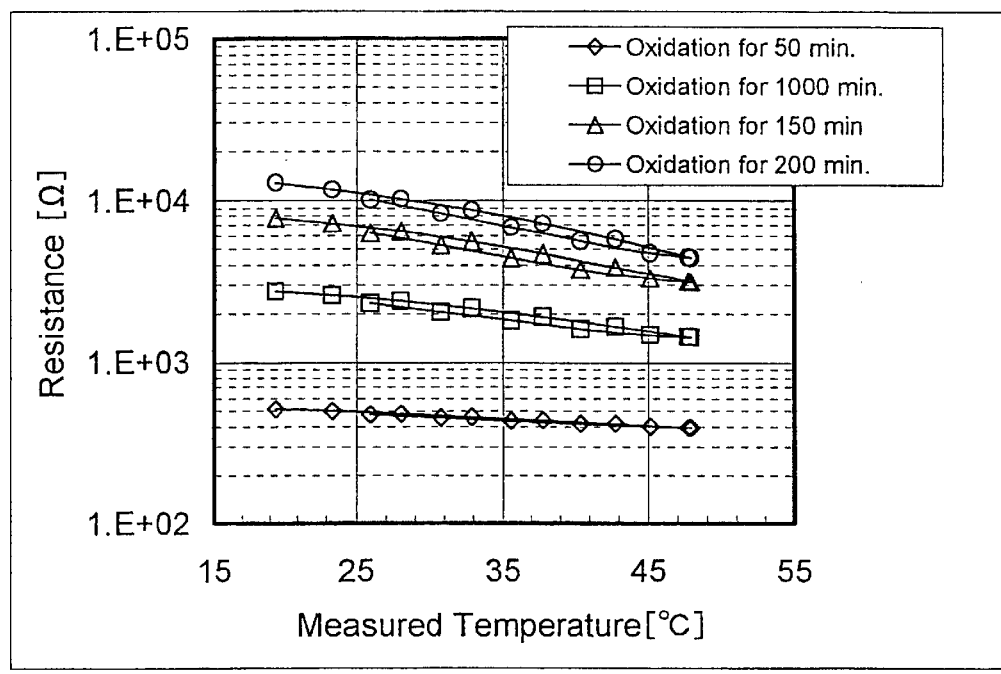
FIG. 2 shows measurement results of temperature dependency of the resistance of a $VO_x$ film prepared according to this invention, indicating dependency of the properties on an oxidation time.

$VO_x$ thin-films were thermally oxidized for 50, 100, 150 or 200 minutes. On each film was formed an indium electrode and the film was evaluated for thermal variation of a resistance in a thermostatic oven. The results are shown in FIG. 2. It can be seen that an increase of a thermal oxidation period to 200 minutes led to an increase of a resistance by more than one digit and of a thermal variation rate of resistance TCR. At another temperature, a period can be similarly adjusted to control a resistance and a thermal variation rate of resistance TCR.

Figure 3:
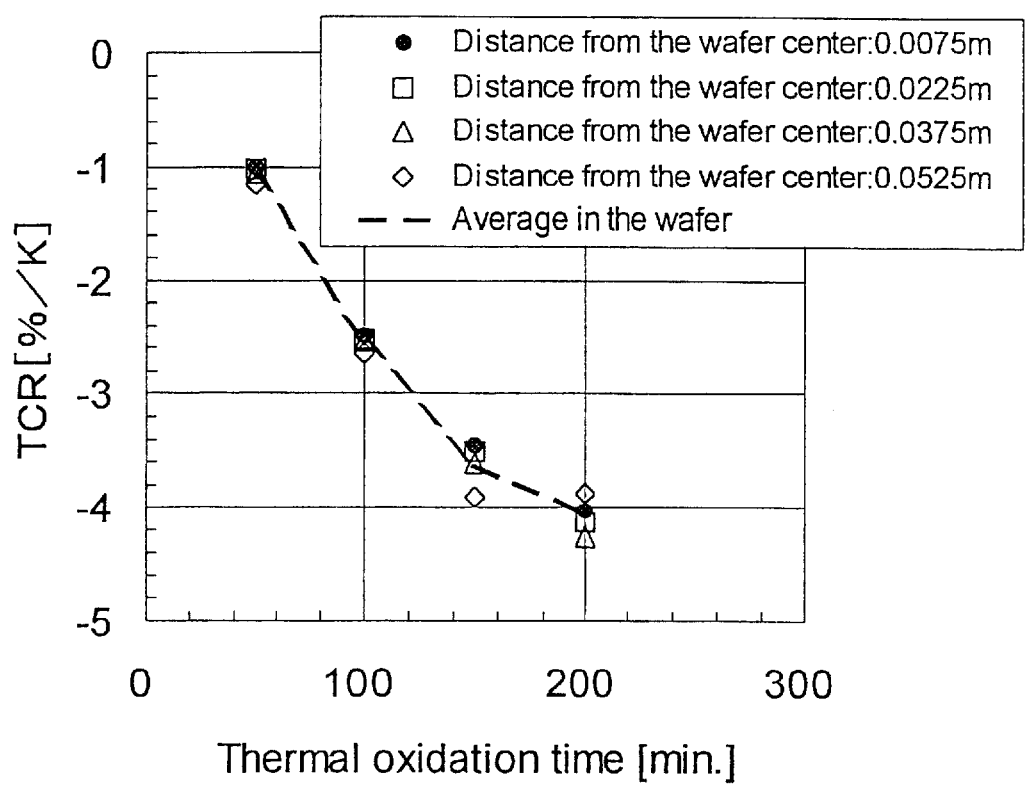
FIG. 3 shows dependency of a TCR on a thermal oxidation time in a process of this invention.
Figure 4:
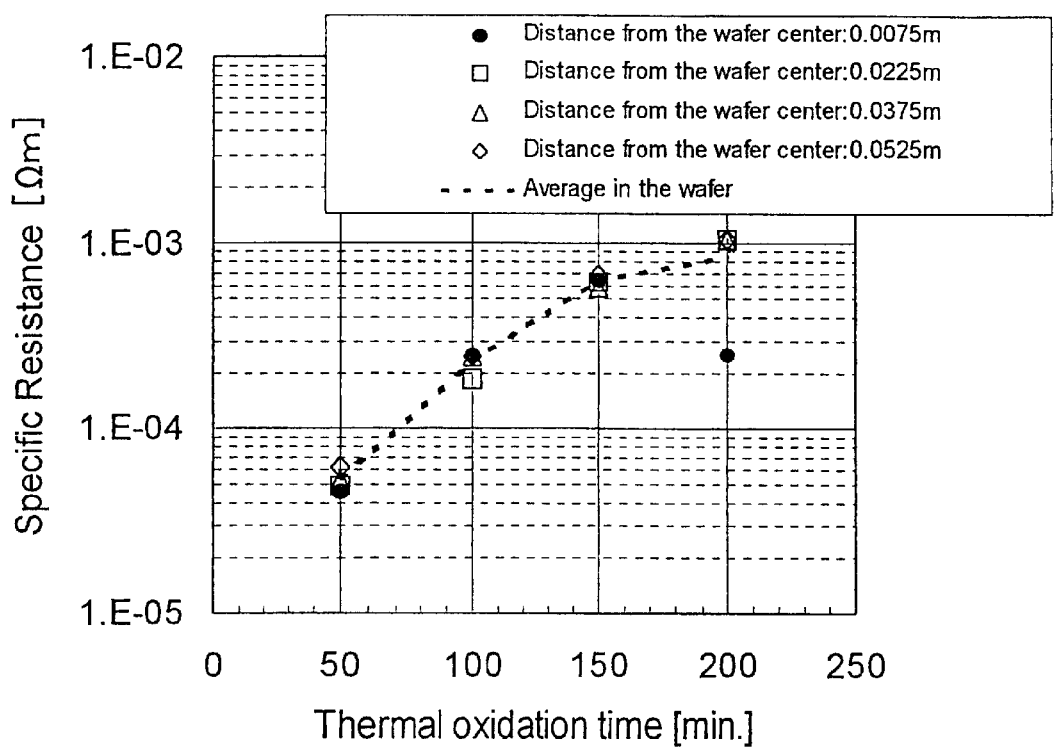
FIG. 4 shows dependency of a specific resistance on a thermal oxidation time in a process of this invention.

Table 2 shows the data obtained by determining a TCR vs. a thermal oxidation time for a $VO_x$ thin-film at a measuring temperature of 25° C. and FIG. 3 shows a graph of the data which indicates dependency of a TCR on a thermal oxidation time. Likewise, Table 3 shows the data obtained by determining a specific resistance vs. a thermal oxidation time for a $VO_x$ thin-film at a measuring temperature of 25° C. and FIG. 4 shows a graph of the data which indicates dependency of a specific resistance on a thermal oxidation time. These tables and figures indicate values obtained at individual points on a 6-inch wafer.

TABLE 2

Temperature coefficients of resistance for $VO_x$ thin-films prepared with different oxidation times [%/K]

| Oxidation time | Distance from a wafer center [m] | | | | Wafer average TCR |
|---|---|---|---|---|---|
| [min] | 0.0075 | 0.0225 | 0.0375 | 0.0525 | [%/K] |
| 50 | −1.01 | −1.02 | −1.06 | −1.16 | −1.06 |
| 100 | −2.49 | −2.53 | −2.55 | −2.65 | −2.55 |
| 150 | −3.46 | −3.52 | −3.61 | −3.91 | −3.63 |
| 200 | −4.03 | −4.13 | −4.26 | −3.88 | −4.07 |

TABLE 3

Specific resistances for $VO_x$ thin-films prepared with different oxidation times [Ωm]

| Oxidation time | Distance from a wafer center [m] | | | | Wafer average |
|---|---|---|---|---|---|
| [min] | 0.0075 | 0.0225 | 0.0375 | 0.0525 | ρ[Ωm] |
| 50 | 4.59E−05 | 4.88E−05 | 5.22E−05 | 6.18E−05 | 5.22E−05 |
| 100 | 2.50E−04 | 1.85E−04 | 2.45E−04 | 2.47E−04 | 2.32E−04 |
| 150 | 6.43E−04 | 6.21E−04 | 5.77E−04 | 6.85E−04 | 6.32E−04 |
| 200 | 2.53E−04 | 1.05E−03 | 1.03E−03 | 1.03E−03 | 8.41E−04 |

As seen from these results, a thermal oxidation time may be adjusted to control $VO_x$ properties. For example, thermal oxidation for 200 minutes may provide a TCR of −4%/K from FIG. 3 and a specific resistance of $1 \times 10^{-3}$ Ωm from FIG. 4. Thus, a $VO_x$ thin-film with a thickness of 0.1μm exhibited a resistance of 10 kΩ as a device. For a higher TCR, a thermal oxidation time may be increased although a longer working time may lead to reduction in working efficiency and in-plane evenness of a wafer surface may be deteriorated. Thus, in thermal oxidation at 250° C., the time may be preferably about 300 minutes or less. Thermal oxidation for 300 minutes may provide a $VO_x$ thin-film with a TCR of about −5%/K at a specific resistance of $2 \times 10^{-3}$ Ωm. A higher thermal oxidation temperature may reduce a treating time. In preparation of a device, a melting point of a metal interconnection material, however, limits a temperature acceptable for processing, so that processing at 400° C. or less is preferable. Treatment at a lower temperature may be susceptible to an ambient temperature to require an apparatus such as a thermostatic oven. For conducting thermal oxidation without using such an apparatus, treatment at 150° C. or higher is preferable.

Figure 1:
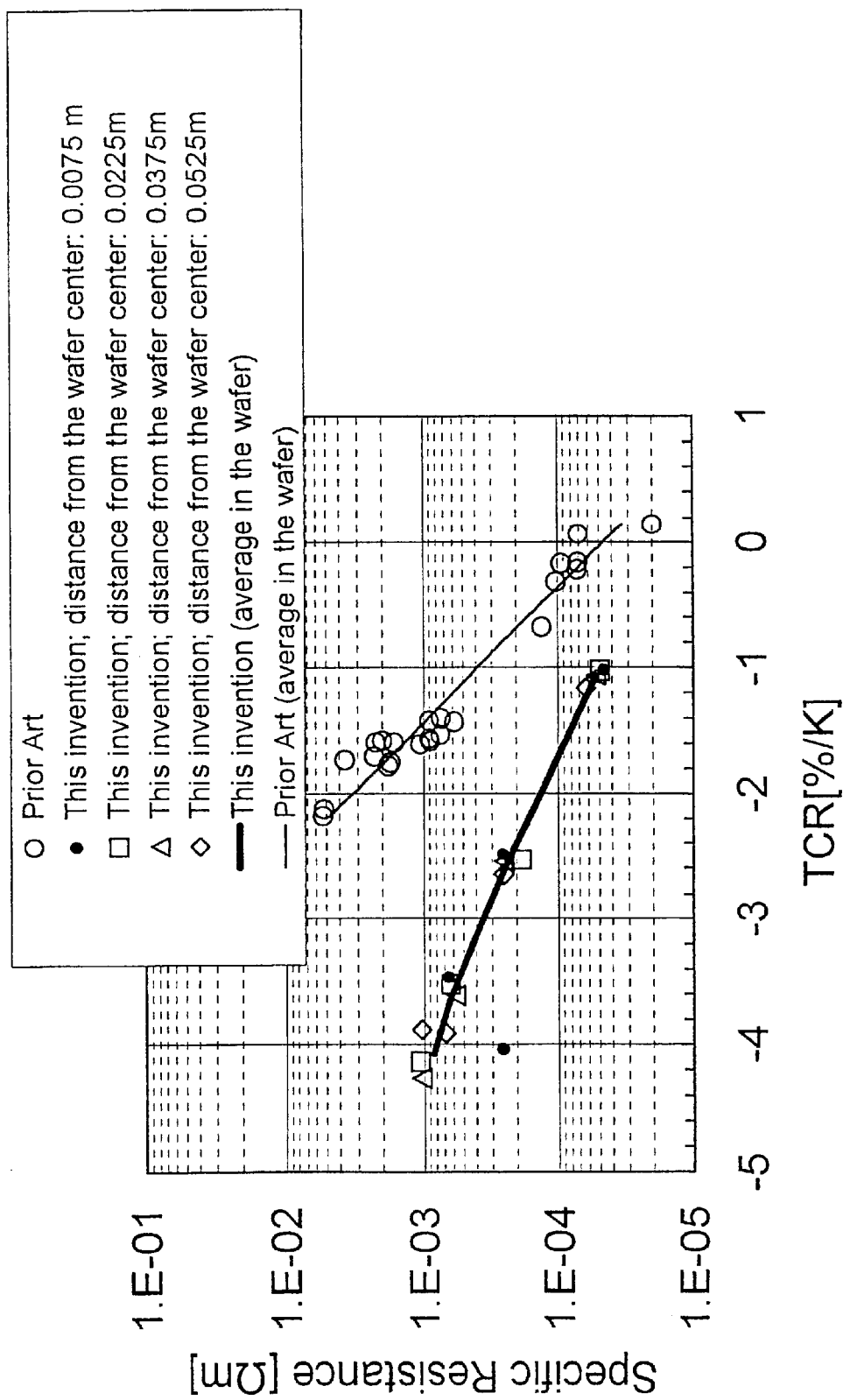
FIG. 1 shows relationship between a temperature coefficient of resistance (TCR) and a specific resistance as the properties of a $VO_x$ film prepared according to this invention, together with relationship between a TCR and a specific resistance in a $VO_x$ film prepared according to the prior art for comparison.

FIG. 1 is a graphical expression of relationship between a specific resistance and a TCR as properties of a $VO_x$ thin-film thus prepared according to this invention. As described above, FIG. 1 contains a plot for properties of a $VO_x$ thin-film prepared according to the prior art for comparison. As seen from FIG. 1, the $VO_x$ thin-film prepared according to this invention exhibits a higher TCR for a given specific resistance than the $VO_x$ prepared according to the prior art. In other words, when preparing a device with a given film thickness according to this invention, a device resistance may be reduced compared with that for a device according to the prior art. This invention, therefore, allows us to form a bolometer device in which a bolometer material exhibits a smaller 1/f noise than that for a $VO_x$ thin-film according to the prior art and which has higher sensitivity (a higher TCR).

For using as a bolometer device, a device must be prepared while maintaining the above properties. Furthermore, it is necessary to form a protective film for avoiding deterioration in the properties after device preparation. In this embodiment, sputtering as a kind of physical deposition was used to coat the $VO_x$ surface. Sputtering was conducted using silicon nitride $Si_3N_4$ as a sputtering target and a high-frequency power of 1 to 3 kW at a sputtering pressure of 0.4 to 1.33 Pa in argon or a gaseous mixture of argon and nitrogen. Using a gaseous mixture of argon, oxygen and nitrogen or of argon and oxygen as a sputtering gas, the $VO_x$ surface may be coated with a silicon oxynitride film $SiO_{x''}N_y$ to form a protective film with a considerably lower stress.

Alternatively, using $SiO_{x''}N_y$ as a sputtering target and argon alone or a gaseous mixture of argon, oxygen and nitrogen, argon and nitrogen or argon and oxygen, the $VO_x$ surface may be similarly coated with $SiO_{x''}N_y$ with a lower internal stress.

A protective film formed may have any thickness as long as it does not cause deterioration with time in the $VO_x$ properties. In this embodiment, it had a thickness of 0.05 to 0.2μm. Such protective film thus formed inhibited deterioration in the properties of the $VO_x$.

What is claimed is:

1. A process for preparing a material for a bolometer using a vanadium oxide $VO_x$ thin-film, wherein crystal phase consisting of $V_2O_3$ (x=1.5) is used as a starting film material and the crystal phase is heated under an oxidizing atmosphere containing oxygen, and wherein heating under the oxidizing atmosphere is conducted at a temperature of 150 to 400° C. both inclusive.

2. The process for preparing a material for a bolometer as claimed in claim 1, wherein heating under the oxidizing atmosphere modifies the crystal phase to $VO_x$ wherein x is in the range of $1.5 < x \leq 2$.

3. A bolometer device comprising at least a bolometer material using a vanadium oxide $VO_x$ thin-film prepared by the preparation process as claimed in claim 2 and a protective film formed thereon.

4. The bolometer device as claimed in claim 3, wherein the protective film is formed by physical vapor deposition.

5. The bolometer device as claimed in claim 4, wherein the protective film formed by physical vapor deposition is a silicon nitride or silicon oxynitride film.

6. The process for preparing a material for a bolometer as claimed in claim 1, wherein a heating time is adjusted to control the properties of the bolometer material.

7. A bolometer device comprising at least a bolometer material using a vanadium oxide $VO_x$ thin-film prepared by the preparation process as claimed in claim 6 and a protective film formed thereon.

8. The bolometer device as claimed in claim 7, wherein the protective film is formed by physical vapor deposition.

9. The bolometer device as claimed in claim 8, wherein the protective film formed by physical vapor deposition is a silicon nitride or silicon oxynitride film.

10. A bolometer device comprising at least a bolometer material using a vanadium oxide $VO_x$ thin-film prepared by the preparation process as claimed in claim 1 and a protective film formed thereon.

11. The bolometer device as claimed in claim 10, wherein the protective film is formed by physical vapor deposition.

12. The bolometer device as claimed in claim 11, wherein the protective film formed by physical vapor deposition is a silicon nitride or silicon oxynitride film.

13. A process for preparing a material for a bolometer using a vanadium oxide $VO_x$ thin-film, wherein crystal phase consisting of $V_2O_3$ (x=1.5) is used as a starting film material and the crystal phase is heated under an oxidizing atmosphere containing oxygen, and wherein the starting crystal phase of $V_2O_3$ with x=1.5 is formed by heating $V_2O_5$ crystal phase under a reducing atmosphere containing hydrogen.

14. A bolometer device comprising at least a bolometer material using a vanadium oxide $VO_x$ thin-film prepared by the preparation process as claimed in claim 13 and a protective film formed thereon.

15. The bolometer device as claimed in claim 14, wherein the protective film is formed by physical vapor deposition.

16. The bolometer device as claimed in claim 15, wherein the protective film formed by physical vapor deposition is a silicon nitride or silicon oxynitride film.

* * * * *